United States Patent
Nolte et al.

(10) Patent No.: US 7,355,917 B2
(45) Date of Patent: Apr. 8, 2008

(54) TWO-DIMENSIONAL DATA MEMORY

(75) Inventors: Norman Nolte, Lehrte (DE); Winfried Gehrke, Sittensen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/548,742

(22) PCT Filed: Feb. 27, 2004

(86) PCT No.: PCT/IB2004/000628

§ 371 (c)(1),
(2), (4) Date: Sep. 9, 2005

(87) PCT Pub. No.: WO2004/081947

PCT Pub. Date: Sep. 23, 2004

(65) Prior Publication Data

US 2006/0218341 A1 Sep. 28, 2006

(30) Foreign Application Priority Data

Mar. 14, 2003 (EP) .................................. 03100652

(51) Int. Cl.
*G11C 7/00* (2006.01)
(52) U.S. Cl. ...................... 365/220; 365/221; 365/239; 365/240; 708/401
(58) Field of Classification Search .............. 365/220, 365/221, 239, 240; 708/401
See application file for complete search history.

(56) References Cited

U.S. PATENT DOCUMENTS

| 5,305,399 | A | * | 4/1994 | Allen et al. ................. 382/234 |
| 5,815,421 | A | * | 9/1998 | Dulong et al. .............. 708/520 |
| 6,552,319 | B2 | * | 4/2003 | Pyyhtia et al. ........... 250/208.1 |

* cited by examiner

*Primary Examiner*—Hoai V. Ho
(74) *Attorney, Agent, or Firm*—Peter Zawilski

(57) ABSTRACT

A two-dimensional data memory (1) comprising memory elements which are arranged in rows and columns, which are designed to store in each case one data word, which in the row direction and in the column direction are coupled locally to their respectively adjacent memory elements such that with each control pulse of a row control signal the data words of the memory elements of all rows are shifted in a shift direction into the memory elements of the respectively adjacent row, with the data words of the last row being shifted into the first row, and such that with each control pulse of a column control signal the data words of the memory elements of all columns are shifted in a shift direction into the memory elements of the respectively adjacent column, with the data words of the last column being shifted into the first column, and which are designed such that an external write access is possible only in respect of at least one predefined row and at least one predefined column and such that an external read access is possible only in respect of at least one predefined row and at least one predefined column.

5 Claims, 2 Drawing Sheets

TWO-DIMENSIONAL DATA MEMORY

Figure 1:
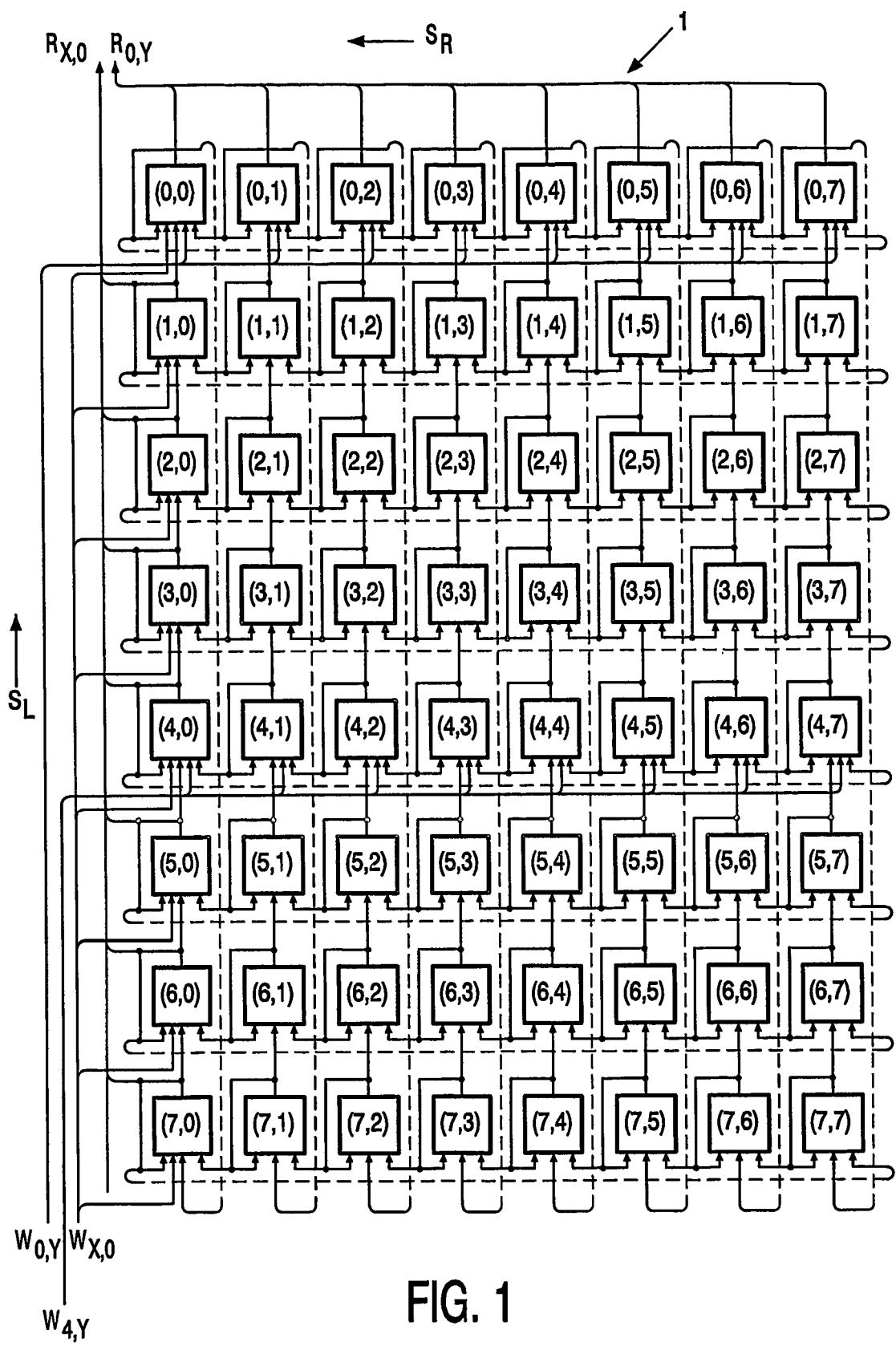

The invention relates to a two-dimensional data memory comprising memory elements which are arranged in rows and columns and are designed to store in each case one data word. A two-dimensional data memory of this type makes it possible to read data words in the row direction or in the column direction. A number of data words of a row or column are where necessary read in parallel at the same time.

If such requirements are placed on conventional one-dimensional memories, then the read data must be resorted in at least one of the dimensions. Moreover, the address generation in such a simulation of a two-dimensional memory by means of a number of one-dimensional memories is very complex. One example of such an arrangement is the memory arrangement according to U.S. Pat. No. 6,105,114.

From the publication "A Low-Power IDCT Macrocell for MPEG2 MP@ML Exploiting Data Distribution Properties for Minimal Activity", T. Xanthopoulos and A. Chandrakasan, 1998 Symposium on VLSI Circuits Digest of Technical Papers, pages 38-39, Honolulu Hi. June 1998, an integrated circuit is known which performs a discrete cosine transform for the purposes of MPEG2 encoding. In a figure, the publication shows a two-dimensional data memory which has memory elements that are coupled to one another in the row direction and in the column direction. In each of the dimensions, the in each case first line of memory elements can be written to and the in each case last line of memory elements can be read. The data are thus shifted in each dimension in each case from the first memory line to the last memory line. This arrangement has the disadvantage that it allows only a pure shifting of data in the manner of a shift register, so that the data are lost following this shift operation.

For many applications, however, it is desired that the data, which where appropriate are shifted in the two-dimensional memory, remain even after a number of shift operations.

It is therefore an object of the invention to provide a two-dimensional data memory of the type mentioned in the introduction, said data memory retaining all the data stored in the memory even after a number of shift operations in one or both dimensions, so that no data are lost following shift operations.

This object is achieved by the features of patent claim 1:

A two-dimensional data memory comprising memory elements which are arranged in rows and columns, which are designed to store in each case one data word, which in the row direction and in the column direction are coupled locally to their respectively adjacent memory elements such that with each clock pulse of a row clock signal the data words of the memory elements of all rows are shifted in a shift direction into the memory elements of the respectively adjacent row, with the data words of the last row being shifted into the first row, and such that with each control pulse of a column control signal the data words of the memory elements of all columns are shifted in a shift direction into the memory elements of the respectively adjacent column, with the data words of the last column being shifted into the first column, and which are designed such that an external write access is possible only in respect of at least one predefined row and at least one predefined column and such that an external read access is possible only in respect of at least one predefined row and at least one predefined column.

In this two-dimensional data memory, the memory elements are locally coupled. The local coupling is provided so that all memory elements of one row of the data memory are coupled to the memory elements of an adjacent row of the data memory such that when a control pulse of a row control signal occurs the data words from the memory elements of the first row are shifted into the respectively adjacent memory elements of the second row. When such a control pulse occurs, this takes place for all memory elements of all rows, which are shifted into respectively adjacent memory elements of the respectively adjacent rows. This is true for the memory elements of all rows, with the exception of the last row in the shift direction. The data of the memory elements of this last row are shifted into the memory elements of the first row as seen in the shift direction.

With regard to the columns, the data in memory elements of respectively adjacent columns are accordingly shifted when a control pulse occurs in a column control signal. In this case, too, the data of the last column are shifted into the memory elements of the first column.

In this way, the data stored in the memory, during shifting of the rows and/or columns, are not shifted just once through the two-dimensional memory but rather the data are fed back into the memory in the manner of a loop so that not only are the data retained but also the sequence of data remains the same in the respective dimension. Only the initial position of the data is shifted in the memory.

Such a memory is thus suitable for example for access by a number of applications. Even if an application has accessed specific data stored in the memory and for this purpose a corresponding shifting of the data in the memory has taken place, nevertheless other applications can subsequently likewise write the data and also in turn shift said data without data being lost in any of these shift operations.

In each of the dimensions, in each case at least one predefined row is provided for writing and/or reading. This must not be the first or last row as seen in the shift direction; rows and/or columns of other positions and where appropriate also a number of rows and/or columns for reading and/or writing may also be provided. This further increases the flexibility of use of the memory, since by way of example a number of processes can access the data or write new data at specific points in time without the data in each case having to be shifted to a specific writing and/or reading row or column.

Besides the above-described retention of data and the possibility of offering multiple access for a number of applications, the two-dimensional data memory has the advantage that the individual memory elements are not individually addressable. Rather, one write signal suffices for all memory elements of a row or column. This minimizes the space requirement in terms of memory integration.

The above-described properties and possibilities of the two-dimensional memory make it possible to further optimize its interaction with external applications, as provided according to one refinement of the invention as claimed in claim 2.

In general, a shifting of the data in the two-dimensional memory in accordance with the control pulses of the row and column control signals is performed with each operating clock of an application which is provided externally outside the memory and which requires a specific number of clock pulses to process data that has been read for example from a specific row of the two-dimensional memory. The two-dimensional data memory is advantageously designed such that the data processed by the external processing unit are written back into that row of the data memory which as seen in the shift direction is a number of rows in front of that row from which the data were read, said number corresponding to the number of clock pulses required by the external application in order to process the data.

Thus, for example, if the external application requires four clocks to process the data read from a specific row of the two-dimensional data memory, then a row into which the data are written back following processing by the external application is advantageously provided in the data memory four rows in front of said row.

The advantage is thus obtained that following processing by the external application the data are written back without any waiting time to the location of the data structure from where they were read prior to processing. The decisive advantage here is that the external application can read data immediately with any time delay.

For the reasons mentioned above, the two-dimensional data memory according to the invention is advantageously also suitable in that the data structure stored therein can be accessed by a number of external applications. A further refinement of the invention as claimed in claim 3 provides that the data memory be designed such that the optimization for a number of external applications, as claimed in claim 2, is possible. Specifically, write and read rows are provided for a number of applications at such relative distances that the above-described reading of externally processed data can be carried out without any delay.

The data stored in the data memory may in particular be, as provided according to a further refinement of the invention as claimed in claim 4, video data which for the purpose of external signal processing are stored in the data memory in rows and columns in accordance with the rows and columns of the video image. In such a use, for example, for the purposes of video compression, it is advantageous that the data memory according to the invention retains the data even after a number of shift operations and thus allows access by a number of applications, that is to say a number of compression processes.

The above-described shift operations of the data in the row and/or column direction may, as provided according to a further refinement of the invention as claimed in claim 5, also be performed in respect of only parts of the rows and/or columns. This is independent of which requirements are placed thereon by external applications.

The shifting of the data of the rows and/or columns does not have to be performed with each operating clock of a clock signal of an external application. It is also possible for pulses to be generated in the row control signal or column control signal only when a shifting of the data in the memory is desired.

The invention will be further described with reference to examples of embodiments shown in the drawings to which, however, the invention is not restricted.

Figure 2:
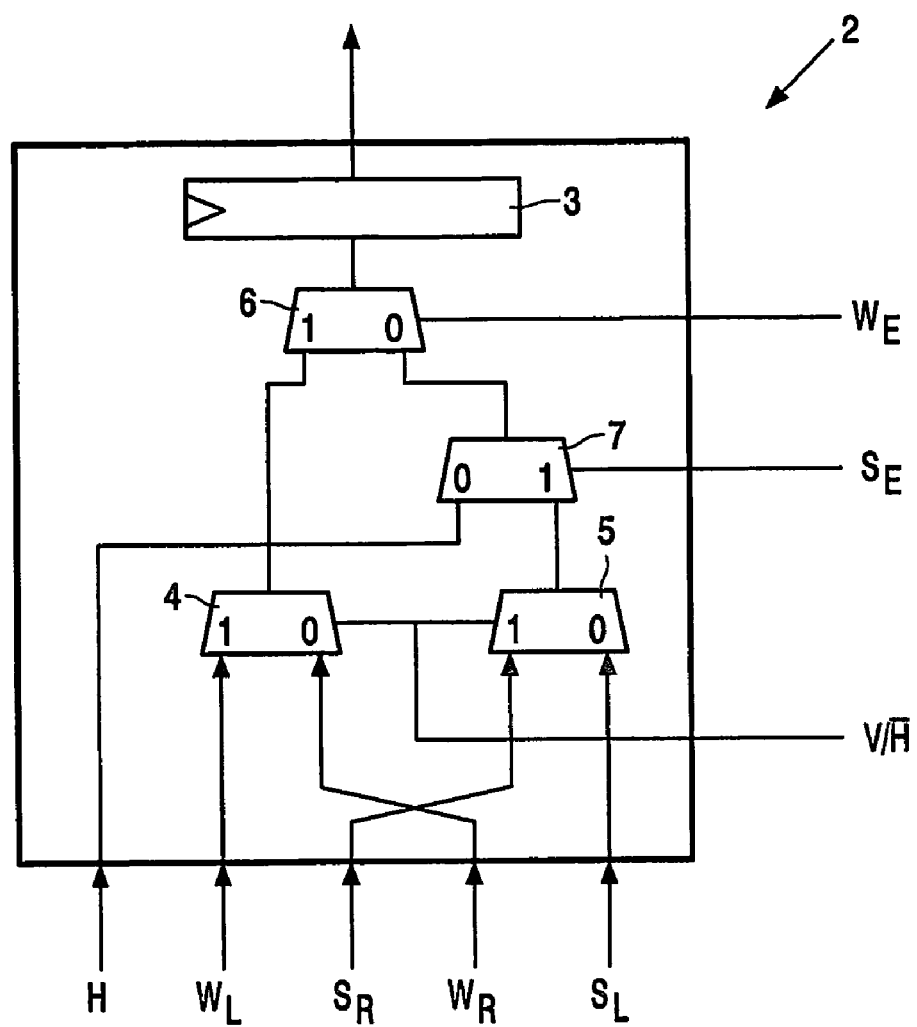

FIG. 1 is a schematic diagram of a two-dimensional data memory according to the invention comprising memory elements arranged in rows and columns and FIG. 2 is a memory element of the arrangement of FIG. 1, which allows the writing and reading of data.

FIG. 1 shows, in the form of a schematic diagram, a two-dimensional data memory according to the invention. The data memory has memory elements which are designed to store in each case one data word. The memory elements are arranged in rows and columns.

In FIG. 1 the memory elements are each (characterized) by two digits which indicate the respective row position and column position of a memory element. The memory elements of the first row of the memory shown in FIG. 1 are characterized by the digits (0,0) to (0,7). Accordingly, the memories at the end of the second row are characterized by (1,0) to (1,7). Since there are a total of eight rows in the two-dimensional memory, the memory elements of the last row have the digits (7,0) to (7,7).

In accordance with this logic, the memory elements of the first column of the two-dimensional data memory have the digits (0,7) to (7,7) and those of the last column have the digits (0,0) to (7,0).

FIG. 1 shows the data lines both for the external supply and removal of data and also the coupling of the memory elements to one another. For the sake of clarity, however, control lines which control a writing or reading of memory elements in the row and/or column direction are not shown in FIG. 1.

A row control signal (not shown in FIG. 1) is provided which with each pulse allows a further shifting of the data stored in the rows of the data memory shown in FIG. 1. With each pulse of the row control signal, the data of a row are shifted into the next row as seen in the shift direction. In FIG. 1 the shift direction for the rows is referenced $S_L$.

When a control pulse of the row control signal occurs, the data which are stored in the memory elements (7,0) to (7,7) are therefore shifted into the respectively adjacent memory elements (6,0) to (6,7). This is performed for the data of all the memory elements of all the rows. The data stored in the first row comprising the memory elements (0,0) to (0,7) are shifted into the memory elements of the row (7,0) to (7,7).

Thus no data are lost during shifting of the data. With each shift operation, the data of the last row as seen in the shift direction are shifted into the memory elements of the first row as seen in the shift direction.

The memory elements are also coupled to one another in the column direction in the same way. In this case, too, there is a column control signal by means of which the data are shifted column-wise in the shift direction $S_R$ in respect of the columns. In the column direction, too, the data of the last column as seen in the shift direction are shifted into the memory elements of the first column as seen in the shift direction.

In each case one or more rows for writing and/or reading may be provided in the row direction and in the column direction. In the example of embodiment shown in FIG. 1, two rows and one column can be written to and one row and one column can be read.

In the diagram of FIG. 1, a data signal $W_{0,Y}$ is shown which supplies data that are written during a write operation into the row comprising the memory elements (0,0) to (0,7). A write signal $W_{4,Y}$ is also shown, the data of which are written during a write operation into the row comprising the memory elements (4,0) to (4,7). Moreover, a data signal $W_{X,0}$ is provided, the data of which can be written into the column comprising the memory elements (0,0) to (7,0).

Data signals $R_{X,0}$ and $R_{0,Y}$ are also provided, these being data read signals which thus supply data that have been read from the two-dimensional memory. The data of the read signal $R_{0,Y}$ originate from the row comprising the memory elements (0,0) to (0,7). The data of the read signal $R_{X,0}$ originate from the column comprising the memory elements (0,0) to (7,0).

In this example of embodiment, one row and one column are provided the memory elements of which are provided both for the reading and for the writing of data. However, this need not be the case; in principle it is possible for any number of rows or columns to be provided for reading and writing purposes, it also being possible for individual rows to be designed only for reading or only for writing.

On account of the type and manner of the above-described shifting of data, the advantage is obtained that all data are retained in the memory and only the position thereof changes. Therefore no data are lost even after shift operations. Despite the change in the position of the data, the data structure, that is to say the sequence of the data, remains unchanged. Only the relative position of the data in the memory changes.

This property of the two-dimensional memory according to the invention makes it possible to design the latter in a very flexible manner for external applications. As a result of the fact that no data can be lost, a number of external applications may access the data which are stored in the two-dimensional data memory. Even after a number of access operations and possibly also shift operations, all data are retained for applications which subsequently access the data.

However, the two-dimensional memory according to the invention allows a further advantageous adaptation to external applications, which will be described hereinbelow.

If, for example, an external application accesses the data of row (0,0) to (0,7), then the results of the processing by the external application should be written back to the memory again. The condition should be observed that the data in the data structure, which meanwhile is shifted further with each pulse of the row control signal, is to be written back to the same position within this data structure. The two-dimensional memory according to the invention allows this since the data structure is retained even during the shift operations and the data, following processing by the external application, can be written back to the same position of the data structure, which meanwhile has been shifted for example by eight clock pulses, into the row comprising the memory elements (0,0) to (0,7). Thus, after the processed data have been written back into this row, the logical position of the data within the data structure is also retained.

However, the particular optimization may additionally consist in matching the write position of the data to the processing time of the external application. If, for example, the external application requires four clock pulses to process the data, then, assuming that the row control signal and the signal of the external application are identical, it would have to wait a further four clock pulses after processing before the data are shifted back into the row comprising the memory elements (0,0) to (0,7) in the eight-row structure of the data memory as shown in FIG. 1. Only then can the data be written back into the same position of the structure of the data stored in the data memory. In order to avoid this waiting time of four additional pulses of the clock signals, in the example of embodiment of FIG. 1 the row comprising the memory elements (4,0) to (4,7), which as seen in the shift direction $S_L$ is positioned precisely four rows in front of that data row comprising the memory elements (0,0) to (0,7), is the row from which the data were read prior to processing.

Thus, the data which have been read from the row comprising the memory elements (0,0) to (0,7) may be written back, following the processing which requires four clock pulses, without any time delay into the row comprising the memory elements (4,0) to (4,7), at the same time meeting the condition that the data are written back into the same position of the data structure since the corresponding row, after four clock pulses, is located precisely in this row of the data memory.

As a result, without any negative aspects, the advantage is obtained that external applications having any processing times can write back the data without any delay while ensuring that the writing back takes place at the correct location of the data structure.

In the example of embodiment shown in FIG. 1, this is provided for the case described above for which the additional write possibility of the memory elements (4,0) to (4,7) has been provided. However, the two-dimensional data memory makes it possible to provide such additional write rows also for further applications, and to do so both in the row direction and in the column direction.

The essential advantage of the data memory according to the invention, namely that no data are lost following a shift operation, can additionally advantageously be used to the effect that a number of applications can write back their data without any delay in the write operation. It is thus possible for the data in the data memory to be used for a number of applications, a time optimization being possible that allows the applications to write back the data immediately after processing.

The diagram of FIG. 1 also shows that the memory elements have to be designed, depending on their position, besides for the shifting of data between the memory elements, also for the reading and/or writing of data from or to external applications. Individual memory elements are provided which allow both reading and writing; in the example of embodiment shown in FIG. 1 this is the memory elements (0,0) and (4,0).

Hereinbelow, the design of these two memory elements will be described in more detail with reference to FIG. 2. In respect of the remaining memory elements, which accordingly need have fewer functions, individual elements of the structure of the memory element shown in FIG. 2 may be omitted. However, in respect of the description of the memory element as shown in FIG. 2 it is to be assumed that the memory element allows both external reading and external writing.

The memory element 2 as shown in FIG. 2 has a memory cell 3 which can accommodate a data word. These data may originate either from an adjacent memory element or from external sources.

The memory cell 3 supplies an output signal which is generally provided to shift the data to an adjacent memory element; however, this signal may also be provided for reading the data for external applications.

In the memory element 2 as shown in FIG. 2, there is a first electronic switch 4 which can be switched by means of a switching signal V/H. A data signal $W_R$ is passed to an input 0 of the electronic switch 4. A data signal $W_L$ is passed to a second input 1 of the electronic switch 4. The data signal WR is a data signal which is to be written to a column of the two-dimensional memory and the data signal $W_L$ is one which is to be written to a row. Depending on the switching signal V/H a switch is made between the two inputs 1 and 0 of the electronic switch 4 as a function of whether writing to a row or to a column of the two-dimensional data memory is to be performed.

Furthermore, FIG. 2 shows a row control signal $S_L$ and a column control signal $S_R$ which are fed respectively to inputs 0 and 1 of a second electronic switch 5 that is likewise switched by the switching signal V/H.

The signal V/H may therefore be used to switch the two electronic switches 4 and 5 and hence the data or clock signals for the operation either in rows or in columns of the two-dimensional memory.

The data output signal from the first electronic switch 4 passes to an input 1 of a third electronic switch 6, which can be switched by means of a write control signal $W_E$ and the output signal of which passes to the input of the memory cell 3.

The output signal from the second electronic switch 5 passes to an input 1 of a fourth electronic switch 7, the other input 0 of which is occupied by a signal H. This is a retaining signal. The electronic switch 7 is namely switched by means of a shift control signal $S_E$ which determines whether or not the pulses of the clock signal coming from the second electronic switch 5 pass to the input 0 of the third electronic switch.

If a corresponding clock signal is passed from the fourth electronic switch 7 to the input 0 of the second electronic switch 6 and if there is a corresponding write signal $W_E$, then the data pass from the first electronic switch 4 and the third electronic switch 6 to the memory cell 3 and are thus written to the latter.

The structure of the memory element as shown in FIG. 2 thus allows the writing of data into the memory cell 3 of the memory element 2 to be controlled as a function of whether the memory element 2 belongs to a row or column that is to be written to or whether a shift control signal $S_E$ and a write signal $W_E$ are given.

Hence the memory element 2 can be controlled such that a shifting of data from an adjacent memory element into this memory element is performed either in the row or column direction or such that external data which are to be rewritten for a row or column are transferred into the memory element 2 or its memory cell 3. As mentioned above, the structure of the memory cell or the structure of the electronic switches may be simpler when the memory cell does not allow external writing and/or reading.

The invention claimed is:

1. A two-dimensional data memory comprising memory elements for storing digital data which are arranged in rows and columns, which are designed to store in each case one data word, which in the row direction and in the column direction are coupled locally to their respectively adjacent memory elements such that with each control pulse of a row control signal the data words of the memory elements of all rows are shifted in a shift direction into the memory elements of the respectively adjacent row, with the data words of the last row being shifted into the first row, and such that with each control pulse of a column control signal the data words of the memory elements of all columns are shifted in a shift direction into the memory elements of the respectively adjacent column, with the data words of the last column being shifted into the first column, and which are designed such that an external write access is possible only in respect of at least one predefined row and at least one predefined column and such that an external read access is possible only in respect of at least one predefined row and at least one predefined column, wherein in order to compensate for the processing time of a signal processing unit provided outside the memory, which processing unit processes data read from a row n or column m of the data memory and takes a time corresponding to k control pulses of the row control signal or of the column control signal, a row or column for writing the data processed by the processing unit is provided in the data memory, said row or column being arranged k rows or columns in front of the row n or column m counter to the shift direction.

2. A data memory as claimed in claim 1, wherein in order to compensate for the processing times of a number of signal processing units provided outside the memory, said processing units having different processing times, there are a number of rows and/or columns provided for writing purposes, the arrangement of which in the two-dimensional memory is tailored to the respective processing times of the signal processing units such that following the respective processing time the data can be written again without further delay to those memory elements from which the data were read prior to their processing.

3. A data memory as claimed in claim 1, wherein the data are video data which for the purpose of external signal processing are stored in the rows and columns of the data memory in accordance with the rows and columns of video images.

4. A two-dimensional data memory comprising memory elements for storing digital data which are arranged in rows and columns, which are designed to store in each case one data word, which in the row direction and in the column direction are coupled locally to their respectively adjacent memory elements such that with each control pulse of a row control signal the data words of the memory elements of all rows are shifted in a shift direction into the memory elements of the respectively adjacent row, with the data words of the last row being shifted into the first row, and such that with each control pulse of a column control signal the data words of the memory elements of all columns are shifted in a shift direction into the memory elements of the respectively adjacent column, with the data words of the last column being shifted into the first column, and which are designed such that an external write access is possible only in respect of at least one predefined row and at least one predefined column and such that an external read access is possible only in respect of at least one predefined row and at least one predefined column, wherein the shifting of data from the rows and columns into the respectively adjacent rows and columns is carried out only in respect of some of the data of the rows and columns.

5. A data memory as claimed in claim 1, wherein the row clock signal and/or the column clock signal only has pulses when a shifting of the respective data within the memory is desired.

* * * * *